(12) United States Patent
Vanagas et al.

(10) Patent No.: US 11,253,955 B2
(45) Date of Patent: Feb. 22, 2022

(54) MULTI-SEGMENT FOCUSING LENS AND THE LASER PROCESSING FOR WAFER DICING OR CUTTING

(71) Applicant: EVANA TECHNOLOGIES, UAB, Vilnius (LT)

(72) Inventors: Egidijus Vanagas, Vilnius (LT); Dziugas Kimbaras, Vilnius (LT); Karolis Zilvinas Bazilevicius, Vilnius (LT)

(73) Assignee: Evana Technologies, UAB, Vilnius (LT)

( * ) Notice: Subject to any disclaimer, the term of this patent is extended or adjusted under 35 U.S.C. 154(b) by 368 days.

(21) Appl. No.: 16/309,992

(22) PCT Filed: Jun. 14, 2016

(86) PCT No.: PCT/IB2016/053486
§ 371 (c)(1),
(2) Date: Dec. 14, 2018

(87) PCT Pub. No.: WO2017/216603
PCT Pub. Date: Dec. 21, 2017

(65) Prior Publication Data
US 2019/0217420 A1 Jul. 18, 2019

(51) Int. Cl.
*B23K 26/38* (2014.01)
*B23K 26/06* (2014.01)
(Continued)

(52) U.S. Cl.
CPC .......... *B23K 26/38* (2013.01); *B23K 26/0624* (2015.10); *B23K 26/0648* (2013.01);
(Continued)

(58) Field of Classification Search
CPC .... B23K 26/38; B23K 26/0624; B23K 26/53; B23K 26/0648; B23K 26/0738;
(Continued)

(56) References Cited

U.S. PATENT DOCUMENTS 4,194,813 A * 3/1980 Benjamin ............. H01S 3/0064
359/297
6,445,491 B2 * 9/2002 Sucha ....................... G06F 1/39
359/330

(Continued)

FOREIGN PATENT DOCUMENTS

| CN | 103551732 A | 2/2014 | |
| FR | WO2016059449 A1 * | 4/2016 | ......... B23K 26/0604 |
| WO | WO-2016059449 A1 * | 4/2016 | ............. H01L 21/78 |

OTHER PUBLICATIONS

International Search Report dated Feb. 23, 2017 for PCT Application No. PCT/IB2016/053486.

*Primary Examiner* — Joel M Attey
*Assistant Examiner* — Adam Michael Eckardt
(74) *Attorney, Agent, or Firm* — AAA Law

(57) ABSTRACT

The invention provides a multi-segment focusing lens for effective laser processing method that allows to cut/scribe/cleave/dice or, generally speaking, separate, hard, brittle, and solid wafers or glass sheets, which are either bare or have microelectronic or MEMS devices formed on them. The multi-segment focusing lens is used in a laser processing method comprises a step of modifying a pulsed laser beam by a shaping and focusing unit, including a multi-segment lens. Said multi-segment lens creates multiple beam convergence zones, more particularly, multiple focal points, said and interference spike shape intensity distribution exceeding the optical damage threshold of the workpiece material. Said interference spike shape intensity distribution is situated in the bulk of the workpiece. During the (Continued)

aforementioned step a modified area is created. The laser processing method further comprises a step of creating a number of such damage structures in a predetermined breaking line or curved trajectory by relative translation of the workpiece in relation to the focal point of the laser beam.

18 Claims, 9 Drawing Sheets

(51) Int. Cl.
    *B23K 26/073*     (2006.01)
    *B23K 26/08*     (2014.01)
    *B23K 26/53*     (2014.01)
    *B23K 26/0622*     (2014.01)
    *H01S 5/00*     (2006.01)
    *B23K 26/402*     (2014.01)
    *B23K 101/40*     (2006.01)
    *B23K 103/00*     (2006.01)
    *H01S 5/02*     (2006.01)

(52) U.S. Cl.
    CPC ...... *B23K 26/0738* (2013.01); *B23K 26/0853* (2013.01); *B23K 26/402* (2013.01); *B23K 26/53* (2015.10); *H01S 5/005* (2013.01); *B23K 2101/40* (2018.08); *B23K 2103/50* (2018.08); *B23K 2103/54* (2018.08); *H01S 5/0202* (2013.01)

(58) Field of Classification Search
    CPC .............. B23K 26/0853; B23K 26/402; B23K 2103/50; B23K 2101/40; B23K 2103/54; H01S 5/005; H01S 5/0202
    See application file for complete search history.

(56) References Cited

U.S. PATENT DOCUMENTS

| | | | | |
|---|---|---|---|---|
| 9,669,492 | B2* | 6/2017 | Linyaev | B23K 26/38 |
| 10,377,658 | B2* | 8/2019 | Schnitzler | B23K 26/53 |
| 2005/0024743 | A1 | 2/2005 | Camy-Peyret | |
| 2005/0219987 | A1* | 10/2005 | Hashimura | G11B 7/13927 |
| | | | | 369/112.08 |
| 2006/0109757 | A1* | 5/2006 | Nishiwaki | B23K 26/361 |
| | | | | 369/44.14 |
| 2008/0050888 | A1* | 2/2008 | Garner | B23K 26/38 |
| | | | | 438/463 |
| 2013/0256286 | A1* | 10/2013 | Sercel | B23K 26/0608 |
| | | | | 219/121.72 |
| 2014/0231085 | A1* | 8/2014 | Zediker | B23K 26/12 |
| | | | | 166/288 |
| 2015/0038313 | A1* | 2/2015 | Hosseini | B23K 26/38 |
| | | | | 501/32 |
| 2015/0151380 | A1 | 6/2015 | Hosseini | |
| 2015/0299018 | A1* | 10/2015 | Bhuyan | B23K 26/53 |
| | | | | 65/29.18 |
| 2016/0025994 | A1* | 1/2016 | Shagam | C23C 14/34 |
| | | | | 356/440 |
| 2016/0067822 | A1 | 3/2016 | Arai et al. | |
| 2016/0193692 | A1* | 7/2016 | Regaard | B23K 26/0626 |
| | | | | 219/121.62 |
| 2016/0288267 | A1* | 10/2016 | Gesuita | B23K 26/707 |

* cited by examiner

MULTI-SEGMENT FOCUSING LENS AND THE LASER PROCESSING FOR WAFER DICING OR CUTTING

FIELD OF INVENTION

The present invention of the multi-segment focusing lens relates to laser material processing. More particularly, it relates to methods for cleaving and/or dicing hard, brittle materials, various glasses and ceramics with a specially shaped laser beam. The invention is useful for separating semiconductor devices formed on a substrate.

BACKGROUND OF INVENTION

Wafer dicing plays a critical role in the fabrication of semiconductor devices, devices which are becoming ever smaller and more complex. The classical methods of dicing are based on the use of a diamond saw for silicon wafers thicker than 100 µm or by laser ablation if they are thinner.

Diamond disk saw technology is limited by its low processing speed (for hard materials). The diamond disk saw produces wide, chipped kerf and low quality edge in general, which in turn degrades device yield and lifetime. The technology is expensive, due to rapid diamond disk degradation, and unpractical owing to the need for water cooling and cleaning. Additionally, the performance is limited when the substrate that is being cut is thin.

Another classical laser processing technology, namely laser ablation, is also limited by its low processing speed and a kerf width which reaches 10-20 µm and is too wide for most applications. Furthermore, laser ablation induces cracks, leaves melted residuals and contaminates the cutting area with debris. A wide area heat affected zone can reduce the lifetime and effectiveness of a semiconductor device.

Both—laser ablation and diamond disk saw techniques cannot be used for specialty wafers where there may be other surface features, such as dye-attached films for adhesive stacking. Such additions make the traditional sawing or ablation processes more difficult and vulnerable to debris. In order to improve the quality of separated devices other laser processing based methods and apparatus have been developed.

One of which is a laser processing and laser processing apparatus described in a U.S. Pat. No. 6,992,026, published on 31 Jan. 2006. The said method and apparatus allows cutting a work-piece without producing traces of fusion and cracking perpendicularly extending out of a predetermined cutting line on the surface of the work-piece. The surface of the work-piece is irradiated with a pulsed laser beam according to the predetermined cutting line under conditions sufficient to cause multiphoton absorption, where the beam is aligned to produce a focal spot (or condensed point: a high energy/photon density zone) inside the bulk of the work-piece, consequently forming modified area along the predetermined cleaving line by moving the focal spot in the cleaving plain. After creating the modified area the work-piece can be mechanically separated with a relatively small amount of force.

The above mentioned processing method and its variations are currently known in the art as 'stealth dicing'. All its variations are based on production of internal perforations by a focused pulsed laser beam at a wavelength for which the wafer is transparent, but which is absorbed by nonlinear processes at the focus, e.g. as in the internally etched decorative blocks of glass. The internal perforation leaves the top and bottom surfaces pristine. The wafers are usually placed on a plastic adhesive tape that is mechanically stretched causing the perforations to crack. It is claimed that no debris, surface cracking or thermal damage, occurs unlike with prior processes. In addition to specialty and multi-layer wafers, microelectromechanical (MEM) system devices can also be separated this way.

The disadvantages of stealth dicing become apparent as, typically, in order to perform Stealth Dicing a high numerical aperture (NA) lens must be applied, which results in a small depth of focus (DOF) and provides tight focusing conditions. This results in multiple cracks extending to random directions on the surface of cleaving and affects the lifetime of devices produced from wafers cleaved this way. Also, stealth dicing has its drawbacks when processing sapphire. These specific disadvantages are not apparent when wafers and substrates are of thicknesses of up to ~120-140 µm and only require one pass per separation line to be diced. However, for thicker wafers (usually 4'; 6' sapphire wafers are >140 µm to 250 µm or more), a number of passes per separation line are required. As a consequence, the material is exposed to laser radiation for prolonged periods of time which has unfavourable influence to final device performance and yield. In addition, multi-pass processing slows down the total processing speed and throughput.

Another method for material processing is disclosed in a US patent application No. US2013126573, published on 23 May 2013. A method is provided for the internal processing of a transparent substrate in preparation for a cleaving step. The substrate is irradiated with a focused laser beam that is comprised of pulses having a pulse energy and pulse duration selected to produce a filament within the substrate. The substrate is translated relative to the laser beam to irradiate the substrate and produce an additional filament at one or more additional locations. The resulting filaments form an array defining an internally scribed path for cleaving said substrate. Laser beam parameters may be varied to adjust the filament length and position, and to optionally introduce V-channels or grooves, rendering bevels to the laser-cleaved edges. Preferably, the laser pulses are delivered in a burst train for lowering the energy threshold for filament formation, increasing the filament length, thermally annealing of the filament modification zone to minimize collateral damage, improving process reproducibility, and increasing the processing speed compared with the use of low repetition rate lasers.

The application of this method results in rough processing applicable only to bare materials and is inconvenient for dicing owing to higher pulse energies required, which leads to unfavourable impact on final semiconductor device performance. In particular, if wafers are diced using this method, resulting light-emitting diodes (LED) are characterized by an increased leakage current, which is in case of high brightness (HB) and ultrahigh brightness (UHB) LEDs strongly reduces performance.

Another US patent application No. US2009032511, published on 2009 Feb. 5, describes a laser beam manipulation method, more specifically, a method to improve beam shaping and beam homogenization, which might be adapted in laser material processing. The invention generally relates to an optical system that is able to reliably deliver a uniform amount of energy across an anneal region contained on a surface of a substrate. The optical system is adapted to deliver, or project, a uniform amount of energy having a desired two-dimensional shape on a desired region on the surface of the substrate. Typically, the anneal regions may be square or rectangular in shape. Generally, the optical system and methods of the present invention are used to preferentially anneal one or more regions found within the anneal regions by delivering enough energy to cause the one or more regions to re-melt and solidify.

Another German patent application No. DE102004001949, published on 2005 Aug. 11, describes a laser machining system, which uses multi-segment lens to focus the laser output onto a parallel axis. Such system might be adapted in laser material processing as well. Five lens segments are spaced uniformly around a circular lens surface with the focal point directed onto a fiber guide. A laser is directed onto the lens. This achieves the best focusing of the laser onto an output point corresponding to the workpiece surface.

Another US patent application No. US2013256286, published on 2013 Oct. 3, describes a method of laser processing using an astigmatic elongated beam spot and ultrashort pulses. An adjustable astigmatic elongated beam spot may be formed from a laser beam having ultrashort laser pulses and/or longer wavelengths to machine substrates made of a variety of different materials. The laser beam may be generated with pulses having a pulse duration of less than 1 ns and/or having a wavelength greater than 400 nm. The laser beam is modified to produce an astigmatic beam that is collimated in a first axis and converging in a second axis. The astigmatic beam is focused to form the astigmatic elongated beam spot on a substrate, which is focused on the substrate in the first axis and defocused in the second axis. The astigmatic elongated beam spot may be adjusted in length to provide an energy density sufficient for a single ultrashort pulse to cause cold ablation of at least a portion of the substrate material.

Another US patent application No. US2012234807, published on 2012 Sep. 20, describes a laser scribing method with extended depth affectation into a work-piece. The method is based on focusing of a laser beam in such a way that intentional aberrations are introduced. The longitudinal spherical aberration range is adjusted to be sufficient to extend depth of focus into a work-piece with a limited transverse spherical aberration range. The method also results in rough processing by high energy pulses to obtain vertical damage traces inside the work piece. High pulse energy is necessary due to the fact that a low numerical aperture lens (having a focal length of tens of millimetres) must be used, which results in loose focusing conditions— the focal spot has a very smooth spatial intensity profile, therefore resulting in operation conditions where above damage threshold energy density is achieved in a large area with a relatively small peak value. Due to the increased requirements for pulse intensity (needed for optical breakdown) an increase in pulse energy is required and makes the processing unattractive for HB and UHB LED where LED leakage current and chip wall rough cracking is critical as mentioned above.

An international patent application No. WO2016059449, published on 2016 Apr. 21, describes a method of laser processing for substrate cleaving or dicing through forming 'spike-like' shaped damage structures. This invention provides an effective means and a method of laser processing for separating semiconductor devices formed on a single substrate or separating high thickness, hard and solid substrates, which is rapid. During preparation of the device or substrate for the cleaving/breaking/dicing procedure an area of damage is achieved by obtaining deep and narrow damage area along the intended line of cleaving. The laser processing method comprises a step of modifying a pulsed laser beam by a focusing unit, such as that an 'spike'-shaped beam convergence zone, more particularly an above workpiece material optical damage threshold fluence (power distribution) in the bulk of the workpiece is produced. During the aforementioned step a modified area (having a 'spike'-type shape) is created. The laser processing method further comprises a step of creating a number of such damage structures in a predetermined breaking line by relative translation of the workpiece relative the laser beam condensation point.

The patent application US2015151380A1 discloses a laser processing method using a distributed focus lens, the laser beam focusing paths, and use of filamentation phenomena in the focus area that is considered as a more rough processing than interference focusing and multiphoton absorption.

The patent application CN103551732A discloses laser processing method using a multifocal Diffractive Optical Element (DOE) which is used at least in a tandem with a plano-convex focusing lens.

The patent application US2005024743 A1 discloses an aspherical lens having at least one aspherical refractive surface shaped to focus the rays of the incident beam onto a straight line segment lying on the optical axis of the optical component. However, this lens and method are related to processing of non-transparent materials such as metals, metal alloys and uses "cutting kerf" that is relevant to laser ablation methods.

Prior art methods impose limitations on substrate thickness, material type and processing quality used for wafer separation. In order to process thicker materials the above mentioned technologies require an increase in laser power, number of laser beam passes per separation line or improved shape of the beam and focal point. As a consequence, this has advert effects both to the semiconductor device performance and the yield of production.

SUMMARY

In order to eliminate the drawbacks indicated above, this invention provides a multi-segment focusing lens design for effective and rapid laser processing method and system, in particular, for separating semiconductor or MEMS devices formed on a single substrate or separating high thickness, hard and solid substrates, glass or ceramic sheets. During preparation of a wafer or substrate for the cleaving/breaking (dicing) procedure, a laser processing method is carried out, which is characterized by the obtained collection of deep and narrow damage areas along the intended line of cleaving. The present method does not require multiple laser beam passes per cutting line therefore increasing the yield of production. Henceforth the term 'workpiece' will be defined to include the terms substrate, wafer, wafer sheet, glass sheet, semiconductor device or similar item, which is prepared for processing and subsequent mechanical separation and will be used interchangeably.

The laser processing method comprises a step of modifying a pulsed laser beam by a focusing element (1). One of the optical surfaces of the focusing element comprises segments, having different radius of curvature. Furthermore, the beam divergence and diameter are adjusted and the beam is focused into the bulk of a workpiece, such that several focal points are formed in the beam convergence zone, more particularly, several focal points are spaced apart on the optical axis of the segment lens, and each focal point is arranged to exceed the optical damage threshold fluence (power distribution) of the workpiece material.

The material is partially or completely transparent to the wavelength of said laser radiation and preferably has a band gap energy above 0.9 eV. Upon irradiation of the workpiece, an array of focal points is situated within the thickness of the workpiece. The array of focal spots forms a 'spike'-shaped structure wherein energy distribution of several foci might overlap, forming an interference elongated high intensity zone of laser radiation. Fluence is set such that multiphoton absorption takes place at least in each of the multiple foci or entire interference elongated high intensity zone, leading to localized melting or Coulomb explosions. A series of modified areas (having an elongated shape as interference field, extending through the multiple foci), also referred to as damage structures, is created in the bulk of the material and along the intended dicing trajectory.

The laser processing method further comprises a step of creating a number of such damage structures in a predetermined breaking line by relative translation of the workpiece (2) in relation to the laser beam focal point. It should be apparent to a person skilled in the art that after forming such line the object can be separated or cut in to two or more smaller pieces having a separation boundary, defined by the sequence of damage areas, by employing the mechanical force.

DESCRIPTION OF DRAWINGS

In order to understand the method better, and appreciate its practical applications, the following pictures are provided and referenced hereafter. Figures are given as examples only and in no way should limit the scope of the invention.

DETAILED DESCRIPTION OF PREFERRED EMBODIMENTS

Figure 1:
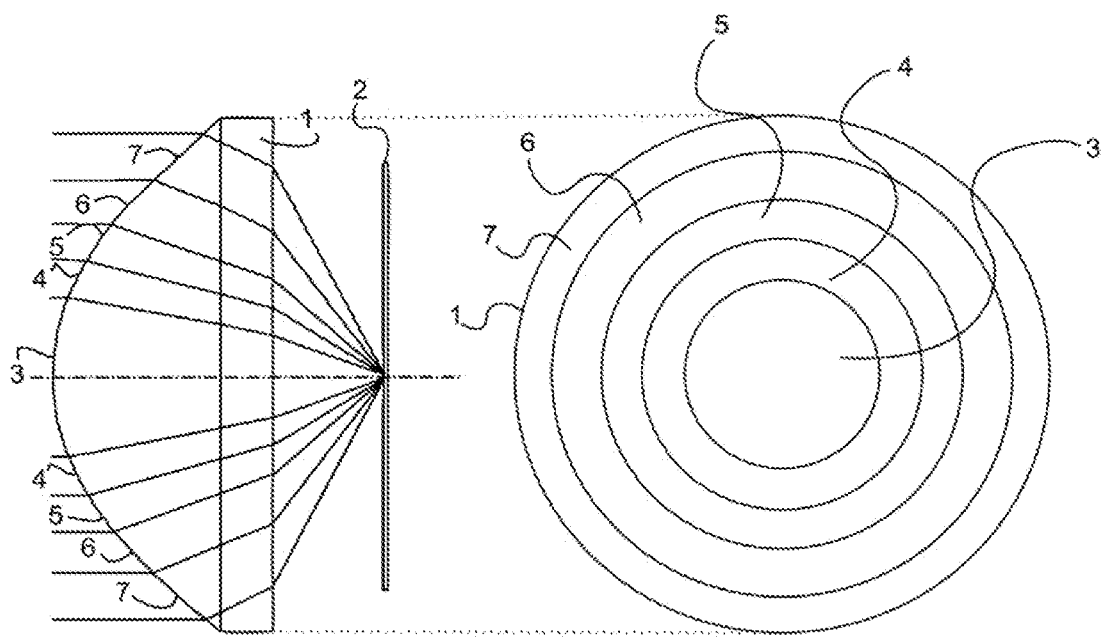
FIG. 1. is a schematic representation of the laser beam propagation through the multi-segment lens. Each line represents a boundary between different parts of the beam, wherein these parts are being formed by segments of the lens surface creating different focal points.

This invention provides a multi-segment focusing lens for use in a laser processing method and a system for separating semiconductor or MEMS devices formed on a single substrate or separating hard and solid substrates. During preparation of a sample for the cleaving/breaking procedure an area of damage is formed, which is characterized by the obtained deep and narrow damage areas along the intended line of cleaving.

In the most preferred embodiment, the processing method comprises steps of providing a pulsed laser beam (13), focussing the laser beam by a focussing element (1), irradiating a workpiece (2) with the focussed pulsed laser beam, forming a sequence of damage zones to produce a cleaving plane. The workpiece material is transparent to the laser radiation and features a band gap energy exceeding the photon energy of the laser. The step of focusing the laser beam involves use of a multi-segment lens (1), wherein at least one surface of the lens comprises segments, having different radius of curvature and each surface segment has a different focal length. Different focal lengths of the segments are used to generate multiple spatially separated focal points onto an optical axis. More particularly, when a specifically pre-shaped laser beam passes the lens (1), incident light rays passing through the different curvature regions are focused into multi-focal points (24). The aspheric nature of each of these regions ensures that no spherical aberration manifests itself at the focal points. Dimensions of the regions (3 to 7) are chosen in such a way that the energy is distributed equally between the foci for a Gaussian shape beam. The lens is designed to have a high numerical aperture, which results in tight multi-focusing. Short distance and energy distribution between the multi-focal points (24) determines the formation of the spike (25) shaped interference intensity distribution along the direction of light penetration. Such distribution can be referred to as a high intensity 'spike' having a certain length.

Figure 6:
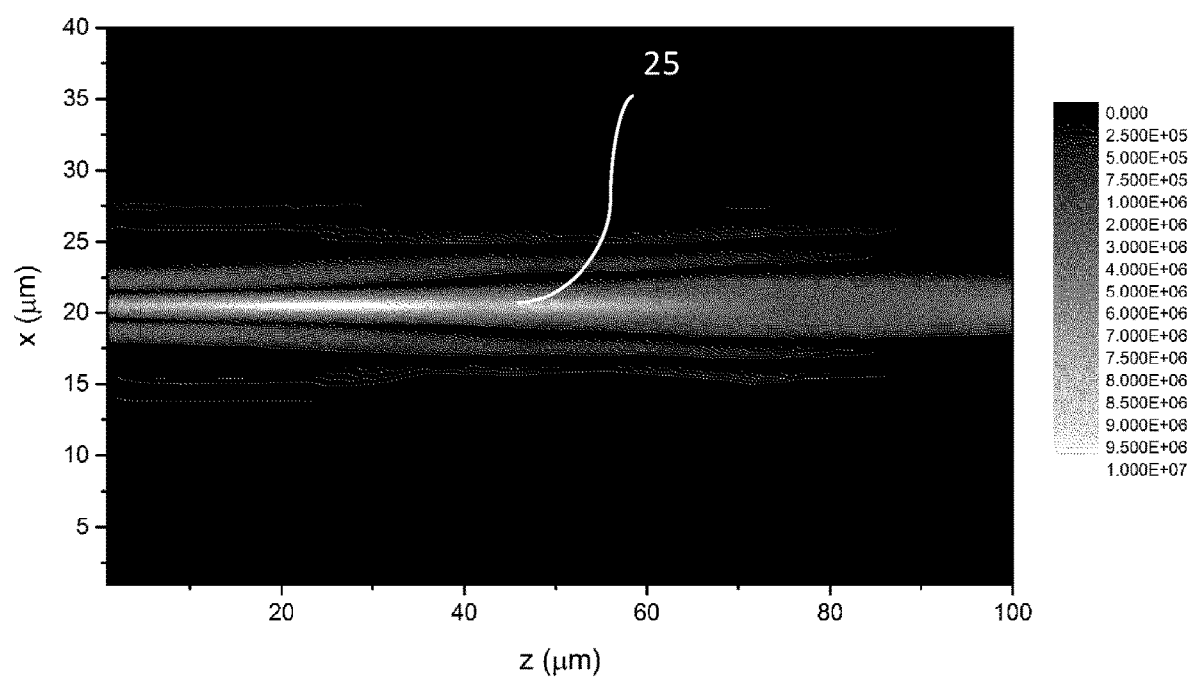
FIG. 6. is a zoomed out illustration of numerically calculated incident laser beam passing through the described lens (1) and forming interference intensity distribution along light penetration direction as a certain length of a 'spike' (25)
Figure 7:
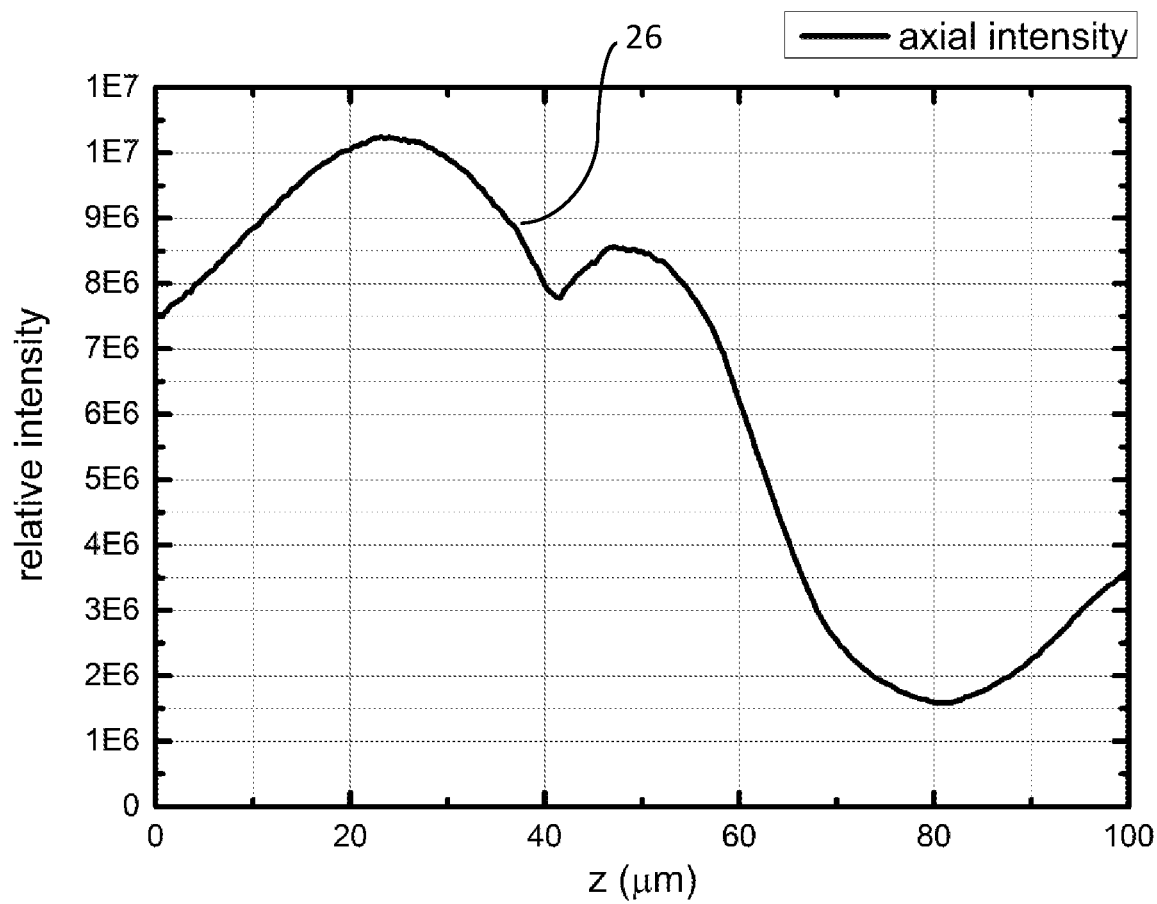
FIG. 7. depicts a numerically calculated light intensity distribution (26) along the 'spike' (25).

The numerical calculation of two dimensional intensity distribution is shown in FIG. 6. Actually, the points (24) effectively blend into a longer 'spike' (25), which extends much deeper into the substrate, as compared to a conventional aspherical lens with one focal point. That is main essence of current invention. FIG. 7 depicts a numerically calculated intensity distribution (26) along the light penetration direction of the laser beam formed 'spike'. This 'spike' is what is needed for inducing an optical breakdown, i.e. reaching higher fluence (power distribution) in the bulk of the workpiece than the optical damage threshold. Such power distribution is formed and situated inside the substrate along a large portion of its thickness and is used for cleaving a wafer (2) or a sheet into smaller parts.

In the most preferred embodiment, the 'spike'-shape fluence distribution has an aspect ratio of 50 times or larger, i.e. it is larger by 50 times or more in the longitudinal direction, as compared to the transverse direction.

Figure 8:
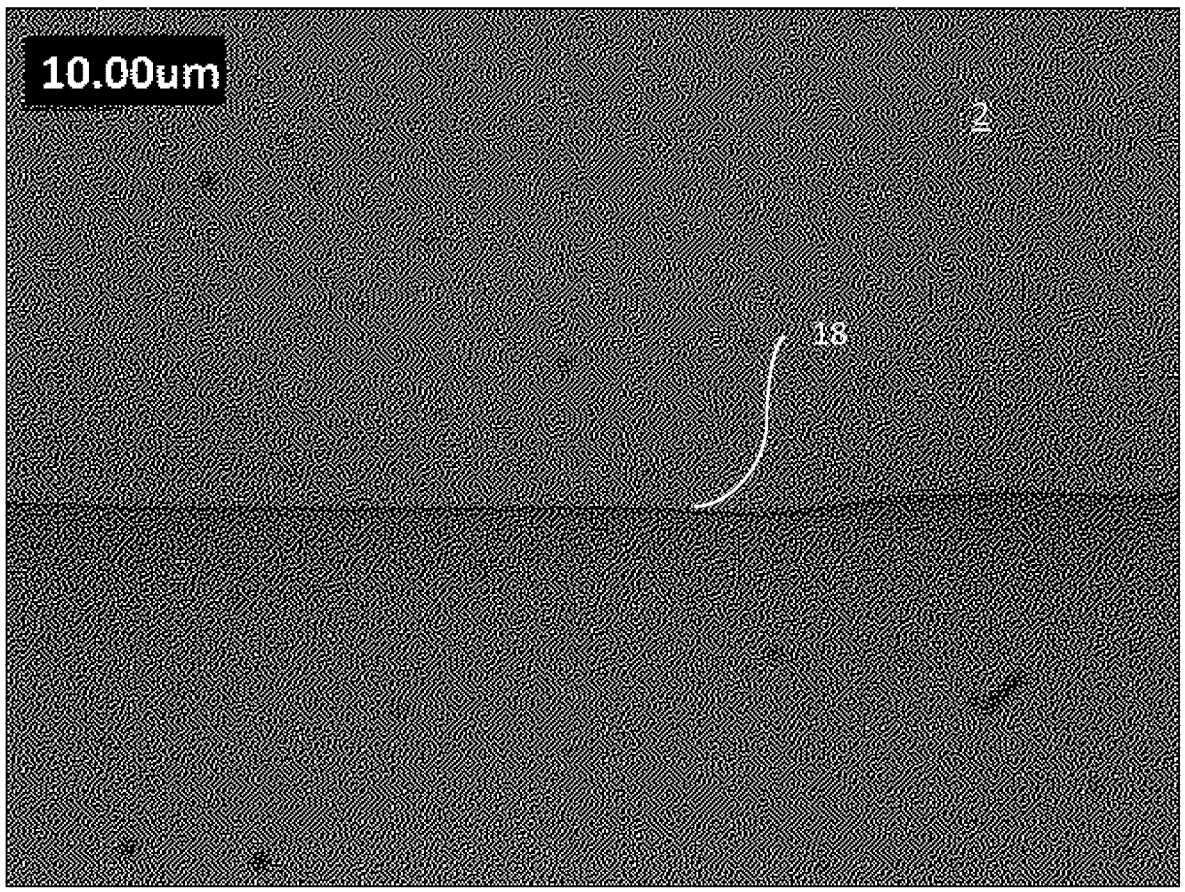
FIG. 8. Shows a microscope image of the workpiece surface having a surface (19) fracture crack (18), which was obtained after processing with high a numerical aperture aspheric concentric ring lens (1) by focusing two laser beams with different divergences.
Figure 9:
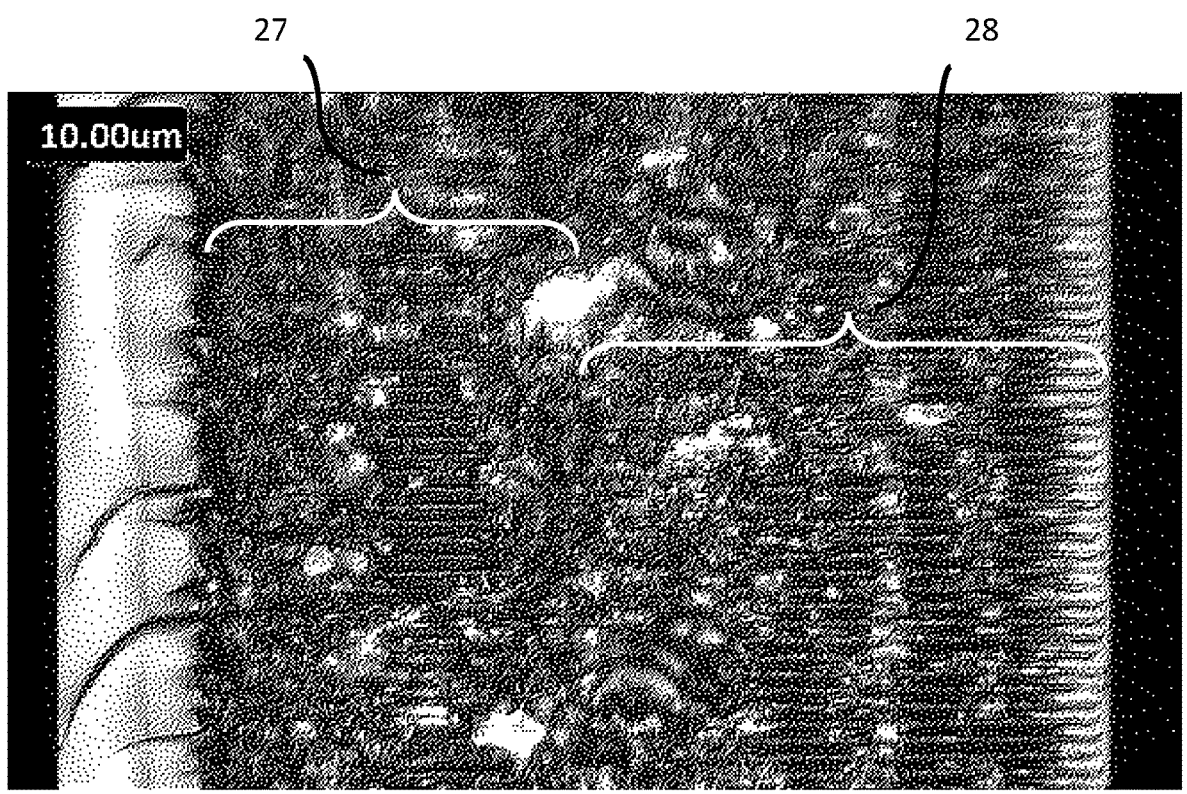
FIG. 9 depicts laser induced damaged areas on a broken edge of a LiNbO3 wafer with approximate thickness of 190 µm. The first laser beam path is represented by the top 60 µm range of a first damage area (27), the second laser beam path is represented by the next 100 µm range of a second damage area (28). This is a good example of another preferred embodiment where several beams with different divergence are focused simultaneously with a single multi-segment lens (1), as described further in this detailed description.

FIGS. 8 and 9 depict the actual processing result obtained with two laser beams having different divergences, simultaneously directed through the special design multi-focus high numerical aperture segmental aspherical lens (1) depicted in FIG. 1.

FIG. 8 depicts a workpiece surface (19) with a surface fracture crack (18), which was obtained after processing the workpiece with a multi-focus high numerical aperture segmental aspherical lens (1), focusing two laser beams with different divergences.

FIG. 9 depicts laser induced damaged areas on a broken edge of a LiNbO3 wafer with approximate thickness of 190 µm. The first laser beam path is represented by the top 60 µm range of the first damage area (27), the second laser beam path is represented by the next 100 µm range of the second damage area (28). This is a good example of another preferred embodiment where several beams with different divergence are focused simultaneously with a single multi-segment lens (1), as described further in this detailed description.

The step of irradiating the workpiece (2) with a focused pulsed laser beam (13) through is performed simultaneously with translation of the workpiece in a direction, which is transversal to the optical axis of the focusing element (1). The focusing of the beam is done in such a way that several beam convergence zones (focal spot, focal point) are formed inside the bulk of the workpiece, creating damage structures matching or closely resembling the shape of the convergence zone. The convergence zone is formed in such a way that its spatial fluence distribution, where the fluence exceeds the damage threshold of the workpiece material, is the shape of a focal point structure as exemplary shown in FIG. 2.

The term 'damage' is defined to refer to any kind of sufficient local modification of the material, by which the mechanical properties are altered enough to produce controlled crack (along the separation boundary) formation during later cleaving steps. The modifications, or damage structures (locally damaged zones, areas), are introduced by the mechanism of multiphoton absorption, which is possible if the workpiece material is partially or completely transparent to the central wavelength (material bandgap exceeds the energy of a single photon energy, preferably multiple times) of laser radiation used and sufficient photon densities achieved by using short and ultrashort pulses and tight spatial condensation, e.g. beam focusing. It is preferred that the band gap energy of the workpiece material exceeds 0.9 eV.

The processing method further comprises repeated irradiation of the sample at spaced positions where a number of damage structures form a breaking/separation line. This is preferably achieved by mounting the workpiece (2) on a motorized assembly of motorized linear translation stage (17) and moving the workpiece in a desired direction, along the intended cleaving line, thus forming the cleaving plane. It should be apparent to a person skilled in the art the different configurations of translation stages can be employed, including rotational stages, a gantry stage, arranged to mobilize the focusing unit, as long the relative movement of focusing unit and workpiece is ensured. Any wafer shaped substrate, wherein the substrate material is a hard and brittle, having a band gap above 0.9 eV, which is difficult to process mechanically, can be used as the workpiece.

Yet in another embodiment, the positioning system is arranged to translate the workpiece (or the focussing element) in a curved, round or elliptical trajectory, in other words, a free-form trajectory. As a result, various 2D structures can be cut from a sheet of material. This is particularly relevant in processing of amorphous or multi-crystalline materials, such as glass or ceramics, including chemically tempered glass.

Figure 2:
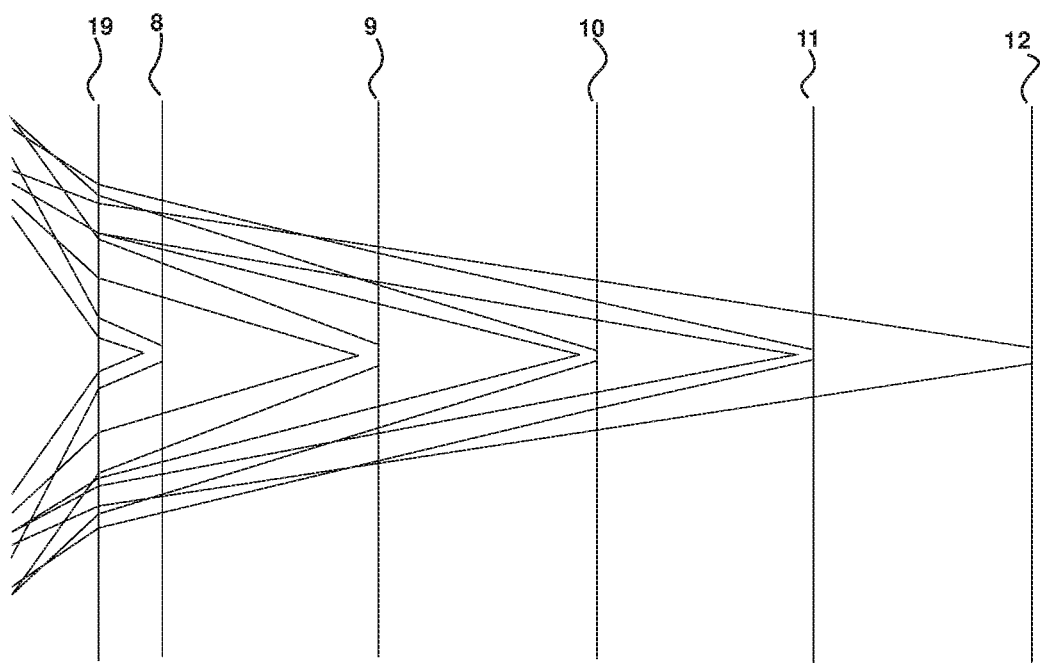
FIG. 2. is a schematic representation of ray tracing inside the workpiece obtained by focusing incoming Gaussian profile intensity distribution laser beam with a multi-segment lens. Each segment of the beam is being focused inside the material on the same optical axis, wherein a series of such damage structures are produced to form a cleaving/breaking plane.
Figure 3:
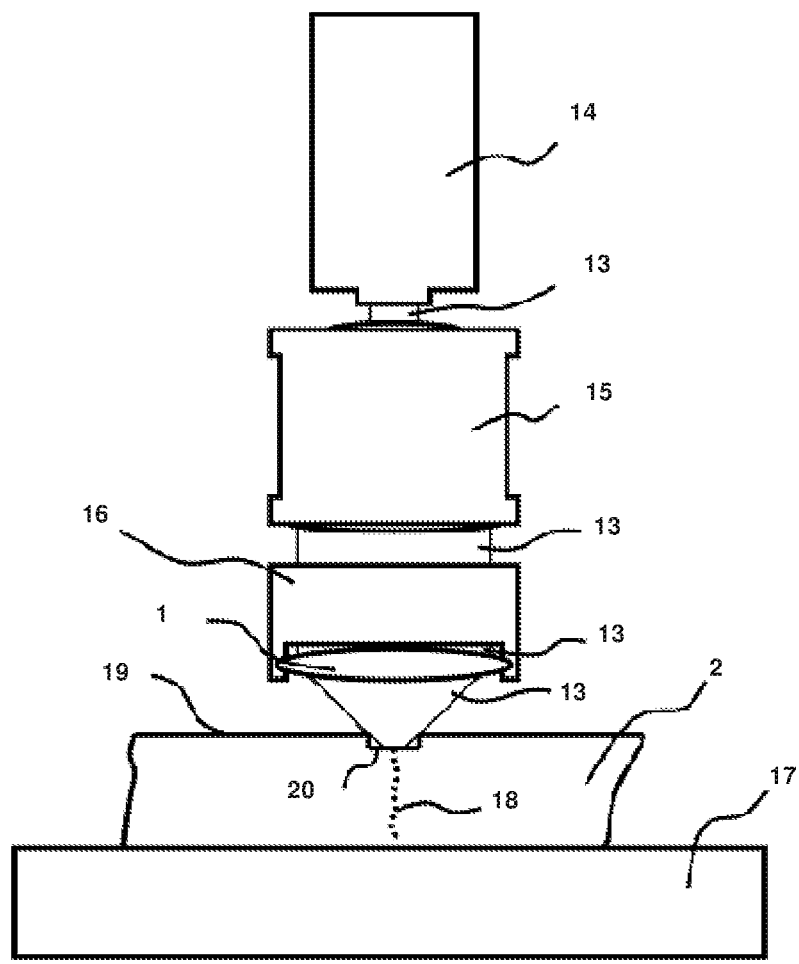
FIG. 3. is a schematic representation of a laser processing system, which is in accordance with the present method and optical system.

In the most preferred embodiment, the process steps are accomplished using a pulsed laser beam (13) source (14), which produces a beam, preferably of a circular-elliptical Gaussian intensity distribution, a beam shaping and focusing unit (1,15,16), comprising an arrangement of a beam focusing element (1), beam shaping unit (15), means of stabilizing the distance between the beam focusing element (1) or and the workpiece (2), as shown in FIG. 3, means for holding and translating (17) a workpiece (2), such as a motorized translation stage assembly. Said pulsed laser beam source (14) is preferably a laser capable of stably producing successive laser pulses of a constant polarization and having a well-defined temporal envelope, preferably Gaussian, having a pulse duration set in the range of 100 to 15 000 fs, a central wavelength set in the range of 500 to 2000 nm, a frequency set in the range of 10 kHz to 2 MHz and a pulse energy sufficient to allow pulses behind the shaping and focusing unit (1,15,16) with a pulse energy in the range of 1 to 100 µJ. The beam shaping optics (15), preferably comprise a beam expander (15), for example a Keplerian or Galilean telescope type beam expander or any other configuration necessary to achieve a proper width and divergence of the beam, before it goes into the focusing element (3). The beam focusing unit preferably comprises a multi-segment lens (1) and means of maintaining a pre-set distance between the lens and the workpiece, e.g. distance monitoring means with a piezoelectric nanopositioner or motorized linear translation stage (16), which maintains the distance between the beam focusing unit (1,15,16) and the workpiece (2) at the focusing element's (16) working distance, with an amount of error up to approximately 2 µm for translation speed of 300 m/s. The beam focusing element (1) should be arranged in such a way that when the beam is focused into several bulks of the workpiece to achieve a focal point shape (spatial distribution of the fluence, which exceeds the damage threshold of the workpiece) with a spatial high intensity distribution equivalent to and/or having the shape of a multiple focal points, as illustrated in FIG. 2. Produced damage structures can also be made to extend from the first surface (19) of the workpiece into the bulk, when necessary, e.g. also by inducing ablation (an ablation produced pit (20)) at the said surface (19).

The numerical aperture of the beam focusing element (1) is preferably high (NA>0.7), however in other embodiments, the NA can be selected in the range from 0.5 to 0.9, as long as the lens design allows to form different segments of the lens, having different radius of curvature, to create several focal points, preferably, one segment is used to create one focal point. An exemplary ray tracing image of said convergence zone is shown in FIG. 2.

Yet in another embodiment, the beam focusing element (1) can be a multi-segment lens (see FIG. 1), arranged to form a multi-point focal spot of the beam. The concave surface of the lens comprises two or more segments, having different radius of curvature and feature different focal length. The segments transition between each other smoothly, which makes the focal spots to transition gradually, forming a 'spike'-shaped focus with several higher fluence zones. The incident laser beam is preferably expanded such that the beam cross-section fills more than 90% of the lens aperture and such lens creates multiple focal points simultaneously (see FIG. 2). In the most preferred embodiment, the beam should be fitted with the lens such that the Gaussian beam intensity at the $1/e^2$ level is close to the circumference of the clear aperture of the multi-segment lens (1).

Preferably, the distance between each laser pulse delivered on the surface may be in the range from 0.1 μm to 10 μm and can be adjusted by changing the movement velocity of the motorized linear translation stage (17), or laser pulse repetition rate, or both. The cleaving/breaking plane is formed by linear movement of motorized linear translation stage (17). The number of passes (repeated translations) for a single cleaving line should be up to 2, nonetheless it is not limited to that. In this case, tight focusing and multiple focal point formation are related and can be controlled by manipulating the multi-segment lens parameters, optical properties of the lens material or the properties of an incident beam.

The objectives of the lens design may depend on the workpiece parameters, such as thickness, band-gap energy, absorption, refractive index, etc. The lens design may be adapted for Gaussian or top-hat beams, aiming for better fluence distribution among the multiple foci. The segments of the lens (1) may be varying in size or surface area.

In another preferred embodiment, the same beam focusing element (1) is employed to simultaneously focus up to 4 coincident laser beams having different divergence, in order to produce multiple arrays of focal points and thus increasing the processing speed or adapting the processing system to process thicker wafers.

Figure 4:
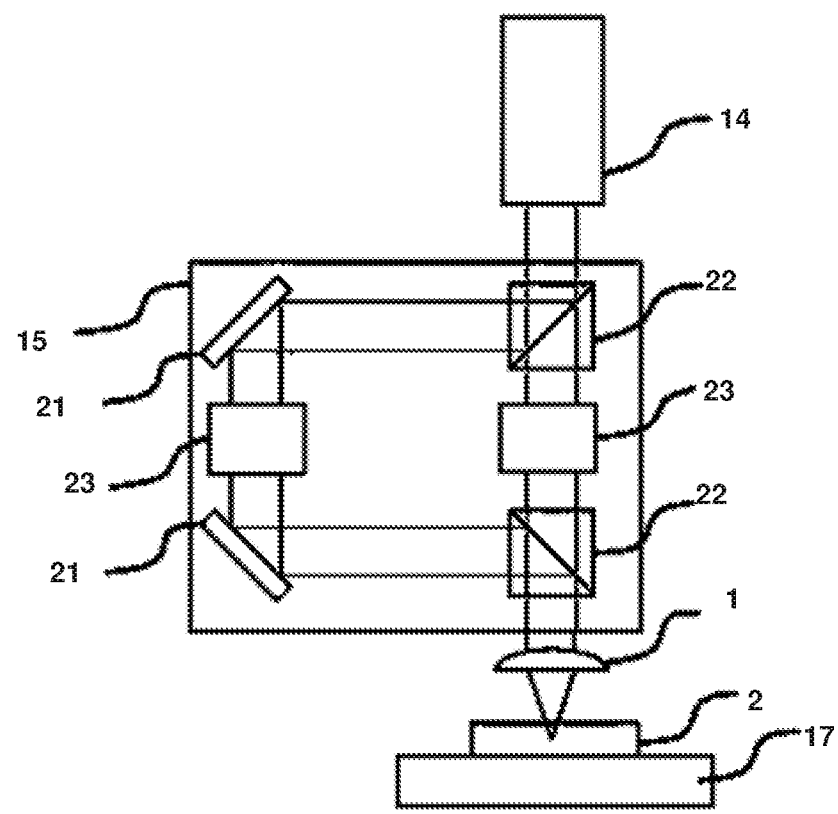
FIG. 4. is a variation of the invention, wherein the optical path is split into two arms by using a beam splitter and beam shaping is performed separately in both arms. Later the two optical paths are made coincident again and directed towards the focusing element.
Figure 5:
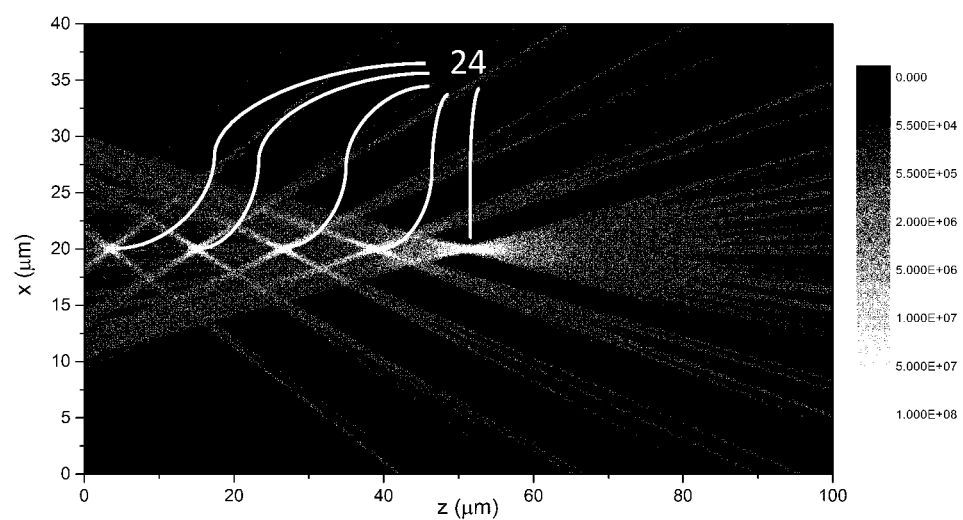
FIG. 5. is a zoomed-out illustration of numerically calculated incident laser beam rays passing through the described lens (1) forming ray-tracing geometry image with multi-focal points (24)

An example of the previously described embodiment is an optical system, comprising means of separating the laser beam (13) into multiple components that would, for example, differ in their polarization or would be separated by delaying the components in time, or separated spatially. The laser beam separation into multiple components can be achieved by means of birefringent devices, beam splitters, polarizers, prisms or other optical elements. Also, previously described means to change the incident beam convergence can be applied to adjust the parameters of the beam in each optical path separately. As a result, multiple laser beams are formed and focused to form multiple convergence zones that yield either multiple narrow damaged structures within the material or yield a more evenly distributed fluence. Therefore, either the whole processing speed is increased, or higher precision is achieved. FIG. 4 depicts one of the possible variations of the beam splitting assembly. Other variations might differ mainly in placement of the beam shaping components. Complete sets of beam shaping components (23) can be arranged in each optical path (as depicted in FIG. 4); in another embodiment, two sets of divergence control units (i.e. telescopes) can be arranged in each optical path separately, but the beam shaper (i.e. a group of lenses) is arranged in the common optical path, before the focusing element (1); in another embodiment, the two sets of divergence control units (i.e. telescopes) can be arranged in each optical path separately, but the beam shaper (i.e. a group of lenses) is arranged in the common optical path, before the beam splitter (22).

In another embodiment, during the step of irradiating a workpiece (2) with a focused pulsed laser beam through a beam focusing unit, the beam focusing unit is arranged to include at least one diffraction element, augmenting or replacing the beam shaping optics, which shapes the incoming beam in such a way that after the beam passes through the beam focusing element (1), multiple focal points are created.

Yet in another embodiment, during the step of irradiating a workpiece (2) with a focused pulsed laser beam through a beam shaping and focusing unit (1, 15, 16), the beam shaping element is arranged to include at least one adaptive optics member, which shapes the incoming beam in such a way that after the beam passes through the multi-segment lens (1), a multiple focal point intensity distribution is created. This allows using a larger variety of incoming beams (or more particularly differently modulated beams) or allow compensation for fluctuating processing parameters. The beam shaping member can be based on Deformable Mirrors, Piezoelectric Deformable Mirrors or similar.

Yet in another embodiment, during the step of irradiating a workpiece with a focused pulsed laser beam through a beam focusing unit, in accordance with the previous embodiment the adaptive optics member can be substituted with at least one phase and/or amplitude modulator member such as Liquid Crystal Light Modulator or a micro-mirror matrix.

Yet in another embodiment, during the step of irradiating a workpiece (2) with a focused pulsed laser beam through a beam focusing unit (1, 15, 16), with accordance with a previous embodiment the adaptive optics member can be substituted with at least one passive diffractive beam modulating element, such as a flat-top beam shaping diffractive optical element, diffractive optical elements for aberration or astigmatism correction. The passive diffractive element is selected by a person skilled in the art in such a way that a beam, modulated with such an element, can be focused with the beam focusing element (1) achieving multiple focal point intensity distribution. It should be noted that the element can also be arranged in the optical path after the beam focusing element (1).

In another embodiment, the beam focusing element, which preferably is a multi-segment lens (1), is used to manipulate the focal spot of the beam in such manner, which is depicted in FIG. 2. Segments of the beam, affected by the multi-segment lens (1), strikes the surface (19) of the workpiece, refracting slightly and focusing in such manner: (8) is a plane, perpendicular to the optical axis of the multi-segment lens (1), on which beam propagating through segment (7) focuses. Accordingly, (9) is the focal plane of the segment (6), (10) is the focal plane of the segment (5), (11) is the focal plane of the segment (4) and (12) is the focal plane of the segment (3).

In order to disclose the present invention better, the following example is provided. The example and parameters disclosed herein are provided to help understand the invention better and in no way limit its extent. These parameters can be changed in a wide interval, reproducing similar or different results, yet the main concept of the dicing process remains the same.

Example 1

The Workpiece material is LiNbO3. The workpiece is in the form of a substrate (slab) with a thickness of approximately 190 μm. The laser source is a femtosecond laser having an output radiation wavelength 1030 nm, pulse width 5 ps (full width at half maximum/1.41), set at an output frequency of 100 kHz. The focusing unit is arranged with a ~0.8 NA multi-focus segmental aspherical lens, as the beam focusing element. Two laser beams set with different divergences were directed via focusing element. Pulses energies after the beam focusing unit is selected to be 3 μJ and 5 μJ respectively, condensation zones of first and second beams are formed at 20 μm and 80 μm below the first surface of the wafer, respectively. Distance between damage structures along cleaving direction is 3 μm. Processing speed, more particularly the translation speed of the linear translation stage, 300 mm/s. Results after processing and breaking/dicing are shown in FIG. 9.

The invention claimed is:

1. A focusing element for use in a laser processing method of substrate cleaving or dicing, the method comprising at least steps of:
   providing a pulsed laser beam;
   focusing the laser beam by said focusing element;
   irradiating a workpiece with the focused pulsed laser beam;
   forming a sequence of damage zones to produce a cleaving plane, wherein the workpiece material is transparent to the laser radiation and features a band gap energy exceeding the photon energy of the laser;
   said focusing element consisting of a single-bodied multi-segment refractive lens, wherein at least one surface of said single-bodied multi-segment refractive lens comprises two or more axially symmetric and concentrically aligned surface segments, having different radius of curvature and each surface segment has a different focal length, wherein said different focal lengths of the segments are used to generate multiple spatially separated focal points, aligned into an interference 'spike'-shaped focal intensity distribution.

2. The focusing element of claim 1, wherein the surface segments of said single-bodied multi-segment refractive lens are aspherical to minimize spherical aberrations at the focal points and to form focal points having elongated "spike"-like shapes.

3. The focusing element of claim 1, wherein said single-bodied multi-segment refractive lens focuses the laser beam in such a way that transverse beam components striking the multiple surface segments of the single-bodied multi-segment refractive lens, are being focused along the optical axis of the single-bodied multi-segment refractive lens into corresponding multiple focal points, which have approximately same distance from each other.

4. The focusing element of claim 1, wherein dimensions of the surface segments are chosen in such a way that energy is distributed equally among the focal points for a laser beam having Gaussian energy distribution cross-section.

5. The focusing element of claim 1, wherein the distance and energy distribution among the focal points determines the formation of an interference intensity distribution along the optical axis of the single-bodied multi-segment refractive lens and light penetration direction, resembling into a 'spike'-shape fluence distribution of a certain length, which extends deep into the substrate to be cleaved or diced.

6. The focusing element of claim 5, wherein the 'spike'-shape fluence distribution has an aspect ratio of 50 times or larger.

7. The focusing element of claim 1, wherein it is arranged to focus the laser beam into the workpiece, wherein the workpiece material is a hard and brittle material or glass with band gap exceeding 0.9 eV, such as silicon carbide, gallium nitride, sapphire, diamond, lithium niobate, glass or similar.

8. A laser processing system, arranged for wafer cutting or scribing or dicing or cleaving, the system comprising at least a pulsed laser beam source, a focusing element and an actuated positioning system for wafer positioning, characterized in that said focusing element is the single-bodied multi-segment refractive lens according to claim 1.

9. The system according to claim 8, further comprising a positioning stage, which is associated with the focusing element and is configured to maintain fixed relative position of the group of focal points with respect to at least one of the workpiece surfaces.

10. The system according to claim 8, wherein the step of forming a sequence of damage zones includes translating the workpiece relatively to the focused laser beam to create a cutting line and repeating the process until the workpiece is diced in to pieces.

11. The system, according to claim 10, wherein the translation is carried out in a trajectory with distance of 0.1 to 10 µm between adjacent damaged structures comprising straight and/or curved and/or circular parts.

12. The system according to claim 8, further comprising a beam shaping unit, which is configured to split the incident beam into at least two optical paths and control divergence in each optical path separately, further the beam shaping unit is configured to combine the beams from said at least two optical paths into a single optical path.

13. The system according to claim 12, wherein the system is configured to split the beam into 2 to 8 separate optical paths.

14. The system according to claim 8, further comprising at least one of a passive diffractive element, a phase or amplitude modulating element, a birefringent element, aberration corrective elements, a flat top beam shaping diffractive element, or any other adaptive optics element.

15. The system according to claim 8, wherein the pulsed laser source is configured to emit laser radiation in the wavelength range of 500 to 2000 nm or the wavelength of a standard laser is adjusted in the range by means of parametric optics.

16. The system according to claim 8, wherein the pulsed laser source is configured to emit laser pulses with a duration in the range of 100 fs to 15000 fs at a repetition rate in the range 10 kHz to 2 MHz.

17. The system according to claim 8, wherein the pulsed laser beam source is configured to emit laser pulses with a pulse energy in the range of 1 to 100 µJ.

18. The focusing element of claim 1, wherein the focusing element is used in a laser processing method and system for separating semiconductor or MEMS devices formed on a single substrate or separating high thickness, hard and solid substrates, glass or ceramic sheets.

* * * * *